(12) United States Patent
Do et al.

(10) Patent No.: US 8,658,470 B2
(45) Date of Patent: Feb. 25, 2014

(54) INTEGRATED CIRCUIT PACKAGING SYSTEM WITH FORMED INTERCONNECTS AND METHOD OF MANUFACTURE THEREOF

(75) Inventors: Byung Tai Do, Singapore (SG); Arnel Senosa Trasporto, Singapore (SG); Linda Pei Ee Chua, Singapore (SG)

(73) Assignee: Stats Chippac Ltd., Singapore (SG)

( * ) Notice: Subject to any disclaimer, the term of this patent is extended or adjusted under 35 U.S.C. 154(b) by 259 days.

(21) Appl. No.: 13/102,052

(22) Filed: May 5, 2011

(65) Prior Publication Data
US 2012/0280408 A1    Nov. 8, 2012

Related U.S. Application Data (60) Provisional application No. 61/442,797, filed on Feb. 14, 2011.

(51) Int. Cl.
*H01L 21/44* (2006.01)
*H01L 21/48* (2006.01)
*H01L 21/50* (2006.01)

(52) U.S. Cl.
USPC .......................... 438/123; 438/124

(58) Field of Classification Search
None
See application file for complete search history.

(56) References Cited

U.S. PATENT DOCUMENTS

| 6,984,877 | B2 | 1/2006 | Lee et al. |
| 7,262,491 | B2 * | 8/2007 | Islam et al. ............ 257/670 |
| 2003/0006055 | A1 | 1/2003 | Chien-Hung et al. |

OTHER PUBLICATIONS

U.S. Appl. No. 61/442,797, filed Feb. 14, 2011, Do et al.

* cited by examiner

*Primary Examiner* — Thien F Tran
(74) *Attorney, Agent, or Firm* — Ishimaru & Associates LLP (57) ABSTRACT

A method of manufacture of an integrated circuit packaging system includes: providing a die paddle having an internal portion with a trench along a perimeter of the die paddle; forming an interconnect having a concave indentation and an upper portion, the upper portion, opposite the concave indentation, aligned horizontally to the internal portion; attaching an integrated circuit device on the die paddle, the trench between the integrated circuit device and the perimeter; attaching an electrical connector to the integrated circuit device and to the upper portion; and applying an encapsulation over the integrated circuit device, the electrical connector, the die paddle, and the interconnect, the concave indentation exposed below the encapsulation.

5 Claims, 8 Drawing Sheets

INTEGRATED CIRCUIT PACKAGING SYSTEM WITH FORMED INTERCONNECTS AND METHOD OF MANUFACTURE THEREOF

TECHNICAL FIELD

The present invention relates generally to an integrated circuit packaging system, and more particularly to a system with formed interconnects.

BACKGROUND ART

Products must be capable of competing in world markets and attracting many consumers or buyers. Market growth for high density and high output/input integrated circuit packages has resulted in a trend for electronic products that are lightweight, smaller in size, multi-functional, and capable of ever increasing higher speeds.

Electronic products such as cell phone base products, global positioning systems (GPS), satellites, communication equipment, consumer products, and a vast line of other similar products are in ever increasing global demand. It is very important for products to continue to improve in features, performance, and reliability while reducing product costs, product size, and to be available quickly for purchase by the consumers or buyers.

Smaller packages need to be electrically connected with other parts and components. As the smaller packages with more circuits continue to get shrink in size, there is a greater need to produce the smaller packages with more and more connectors to support continually increasing amounts of electrical connections to and from those smaller packages.

Thus, an increasing need remains to increase the electrical connections of packages as the sizes of the packages continue to shrink in size while the circuits inside those packages continue to increase. It is also critical that the electrical connections are created and placed with precision so that each of the electrical connections can be spaced apart from one another. Smaller packages must be able to connect to circuit boards and deliver increasing functionality, speed, and performance. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve reliability and product yields to meet competitive pressures adds an even greater urgency to the critical necessity for finding answers to these problems.

Solutions to these problems have been long sought after but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a die paddle having an internal portion with a trench along a perimeter of the die paddle; forming an interconnect having a concave indentation and an upper portion, the upper portion, opposite the concave indentation, aligned horizontally to the internal portion; attaching an integrated circuit device on the die paddle, the trench between the integrated circuit device and the perimeter; attaching an electrical connector to the integrated circuit device and to the upper portion; and applying an encapsulation over the integrated circuit device, the electrical connector, the die paddle, and the interconnect, the concave indentation exposed below the encapsulation.

The present invention provides an integrated circuit packaging system, including: a die paddle having an internal portion with a trench along a perimeter of the die paddle; an interconnect having a concave indentation and an upper portion, the upper portion, opposite the concave indentation, aligned horizontally to the internal portion; an integrated circuit device on the die paddle, the trench between the integrated circuit device and the perimeter; an electrical connector attached to the integrated circuit device and to the upper portion; and an encapsulation over the integrated circuit device, the electrical connector, the die paddle, and the interconnect, the concave indentation exposed below the encapsulation.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGS. Similarly, although the views in the drawings shown for ease of description and generally show similar orientations, this depiction in the FIGS. is arbitrary for the most part. Generally, the invention can be operated in any orientation.

The same numbers are used in all the drawing FIGS. to relate to the same elements. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Figure 1:
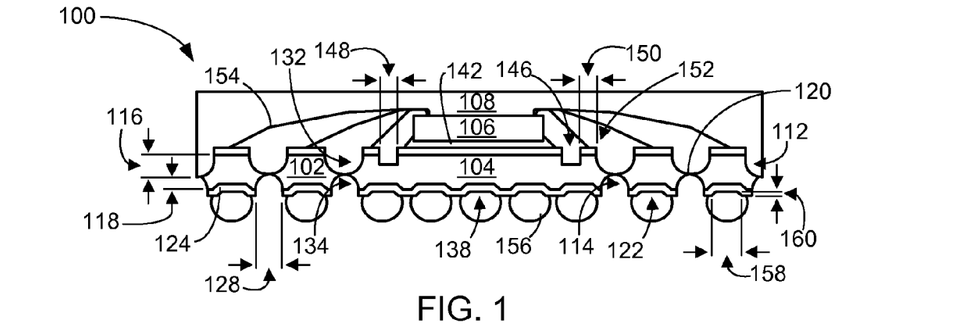
FIG. 1 is a cross-sectional view of an integrated circuit packaging system taken along a line 1-1 of FIG. 2 in a first embodiment of the present invention.
Figure 2:
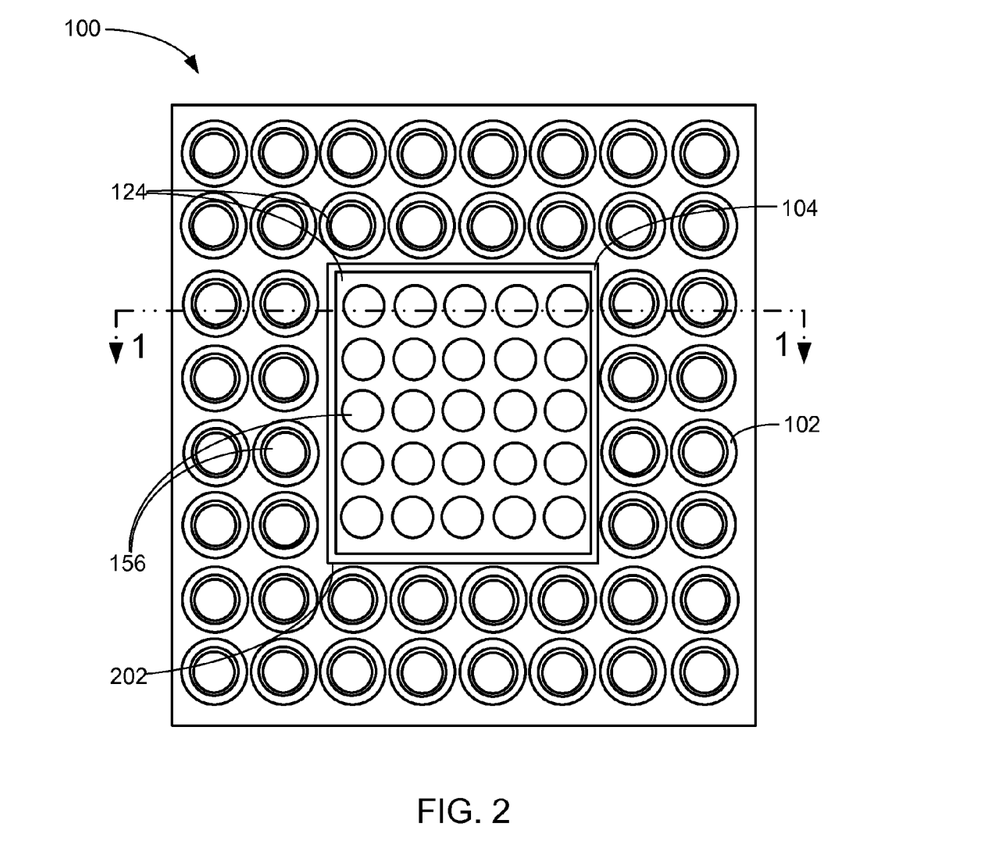
FIG. 2 is a bottom view of FIG. 1.

Referring now to FIG. 1, therein is shown a cross-sectional view of an integrated circuit packaging system 100 taken along a line 1-1 of FIG. 2 in a first embodiment of the present invention. The integrated circuit packaging system 100 includes interconnects 102 aligned horizontally adjacent to a die paddle 104, an integrated circuit device 106 mounted over the die paddle 104, and an encapsulation 108 covering the integrated circuit device 106 and a portion of the die paddle 104 and of the interconnects 102.

The interconnects 102 are formed of an electrically conductive material that can include a copper, a copper alloy, or a material having properties similar to properties of the copper or copper alloy. Each of the interconnects 102 are formed having an upper portion 112 integral with a lower portion 114. The upper portion 112 and the lower portion 114 of the interconnects 102 have non-horizontal curved shaped sides that are exposed from a conductive plating 124.

The vertical distance from an end of the upper portion 112 and the intersection of the upper portion 112 and the lower portion 114 is defined as an anchor depth 116. The vertical distance from an end of the lower portion 114 and the intersection of the upper portion 112 and the lower portion 114 is defined as a standoff height 118. A ridge shaped protrusion 120 is formed at the intersection of the upper portion 112 and the lower portion 114.

For illustrative purposes, the anchor depth 116 is shown to be twice the standoff height 118 to increase pullout resistance of the interconnects 102. The anchor depth 116 and the standoff height can have other dimensional relationships. For example, the anchor depth 116 can be one-half of the standoff height 118 to provide for an increase in package Z-height or an increased pitch of the interconnects 102.

A concave indentation 122 is defined as a cavity having a concaved interior shape. The end of the lower portion 114 is formed having the concave indentation 122. The conductive plating 124 can be used to optionally cover the end of the lower portion 114 including the concave indentation 122. The conductive plating 124 can be formed having a pre-determined thickness.

The conductive plating 124 can be formed of a material that improves cohesive characteristics between the interconnects 102 and a connective material used to connect the integrated circuit packaging system 100 to a next level of integration (not shown), such as a printed circuit board, an electronic component, or a package. The connective material can include solder, metal, metal alloys, or other electrically conductive material.

The upper portion 112 is covered with the conductive plating 124 to provide a surface for connectivity with circuitry of the integrated circuit device 106 and serve as an etch stop during assembly processing. The integrated circuit device 106 is defined as a semiconductor device having active circuitry fabricated thereon and can include an integrated circuit die, an integrated circuit component, or a combination thereof.

The lower portion 114 of the interconnects 102 can be separated from one another by a spatial distance 128. The spatial distance 128 is defined as a horizontal distance separating the lower portion 114 of one of the interconnects 102 and the lower portion 114 of another of the interconnects 102.

The die paddle 104 can be surrounded by the interconnects 102 and be formed of the electrically conductive material used to form the interconnects 102 or of a material having properties similar to properties of the electrically conductive material. The die paddle 104 is formed having an internal portion 132 integral with an external portion 134.

An intersection of the internal portion 132 and the external portion 134 is coplanar with the area formed at the intersection of the upper portion 112 and the lower portion 114. A cross-sectional area formed at the intersection of the internal portion 132 and the external portion 134 is greater than a surface area of the component side of the internal portion 132 or a surface area of the system side of the external portion 134.

The external portion 134 can optionally include at least one paddle indentation 138 having dimensions of the concave indentation 122. The paddle indentation 138 can optionally be covered with the conductive plating 124.

The conductive plating 124 improves cohesive characteristics between the die paddle 104 and the connective material used to connect the integrated circuit packaging system 100 to the next level of integration. The internal portion 132 is covered with the conductive plating 124 to provide a surface for connectivity with circuitry of the integrated circuit device 106 and serve as an etch stop during assembly processing.

An attachment layer 142 can be used to attach the integrated circuit device 106 to the conductive plating 124 on the die paddle 104. The attachment layer 142 is defined as an adhesive material that can include a glue, a film, an epoxy, or any combination thereof.

The conductive plating 124 can also be exposed around the attachment layer 142 and the integrated circuit device 106. The die paddle 104 has a trench 146 around the integrated circuit device 106 and a periphery of the die paddle 104. The trench 146 can be segmented, formed adjacent one or some sides of the integrated circuit device 106, or completely surround the integrated circuit device 106.

The trench 146 can be formed to penetrate the die paddle 104 to expose a portion of the die paddle 104 from within the trench 146. The trench 146 can be formed having a trench width 148 measured horizontally from one side of the trench 146 to an opposite side of the trench 146. The trench 146 can have a cross-sectional outlined shape of a polygon with straight sides, curved sides, or any side combinations thereof.

The conductive plating 124 on paddle bond sites 152 along the periphery of the internal portion 132 can be used to electrically connect the die paddle 104 with the integrated circuit device 106. The paddle bond sites 152 can include a bond site width 150 measured horizontally across opposing sides of the paddle bond sites 152. The bond site width 150 can be less than the trench width 148.

Electrical connectors 154 attached to the integrated circuit device 106 and the paddle bond sites 152 or the conductive plating 124 covering the upper portion 112 provide connectivity between the integrated circuit device 106 and the die paddle 104 or the interconnects 102. The electrical connectors 154 can include wires, leads, bond wires, or any combination thereof.

The encapsulation 108 can cover the upper portion 112 of the interconnects 102, the internal portion 132 of the die paddle 104, the integrated circuit device 106, and the electrical connectors 154. The encapsulation 108 protects and hermetically seals the contents of the integrated circuit packaging system 100 while exposing the lower portion 114 of the interconnects 102 and the external portion 134 of the die paddle 104.

Package connectors 156 can be attached directly to the concave indentation 122 or to the conductive plating 124 optionally covering the concave indentation 122. The package connectors 156 are formed from the connective material and can have shapes characteristics of an elliptical shape, a spherical shape, a cylindrical shape from printing, or any combination thereof.

The concave indentation 122 can be formed having a shape and dimensions that will capture and cup the package connectors 156. The non-horizontal curved shaped sides of the lower portion 114 surrounding the concave indentation 122 are exposed from the package connectors 156. A cup diameter 158 is defined as a diameter of an open end of the concave indentation 122. A cup depth 160 is defined as a perpendicular distance measured from the open end to a closed end of the concave indentation 122.

The cup diameter 158 and the cup depth 160 of the concave indentation 122 can be pre-determined and formed to capture from ten percent to fifty percent of a diameter of the package connectors 156. Diameters of the package connectors 156 captured by the concave indentation 122 can range from four tenths of a millimeter to less than twenty-five hundredths of a millimeter.

It has been discovered that the concave indentation 122 of the interconnects 102 eliminates package or board level failures from multi-directional forces or stress applied to the interconnects 102.

It has also been discovered that the cup diameter 158 and the cup depth 160 of the concave indentation 122 provides a flexible packaging solution that is adaptable to print or ball types of the package connectors 156.

It has further been discovered that the trench 146 prevents overflow or contamination of the paddle bond sites 152 from the attachment layer 142 to improve yield and reliability for the integrated circuit packaging system 100.

It has yet further been discovered that the combination of the spatial distance 128, the standoff height 118, and the cup diameter 158 and the cup depth 160 of the concave indentation 122 provides the interconnects 102 with attachment capabilities for the package connectors 156 to be of balled or print technologies and having any pitch or size.

It has yet further been discovered that the combination of the ridge shaped protrusion 120, the curved shaped sides of the interconnects 102, and the concave indentation 122 of the interconnects 102 provide superior board level reliability by preventing relative movement between the package connectors 156 and the interconnects 102 and relative movement between the interconnects 102 and the encapsulation 108.

Referring now to FIG. 2, therein is shown a bottom view of FIG. 1. Shown are the package connectors 156 on the conductive plating 124 within a perimeter 202 or the periphery of the die paddle 104 and the interconnects 102. The encapsulation 108 is also shown surrounding the die paddle 104 and each of the interconnects 102.

Figure 3:
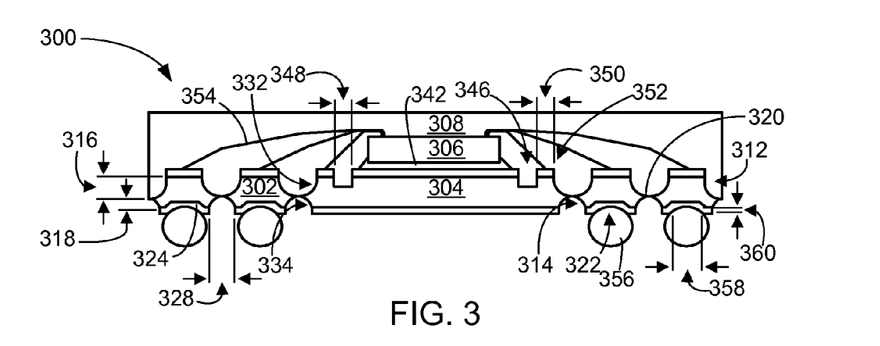
FIG. 3 is a cross-sectional view of an integrated circuit packaging system taken along a line 3-3 of FIG. 4 in a second embodiment of the present invention.
Figure 4:
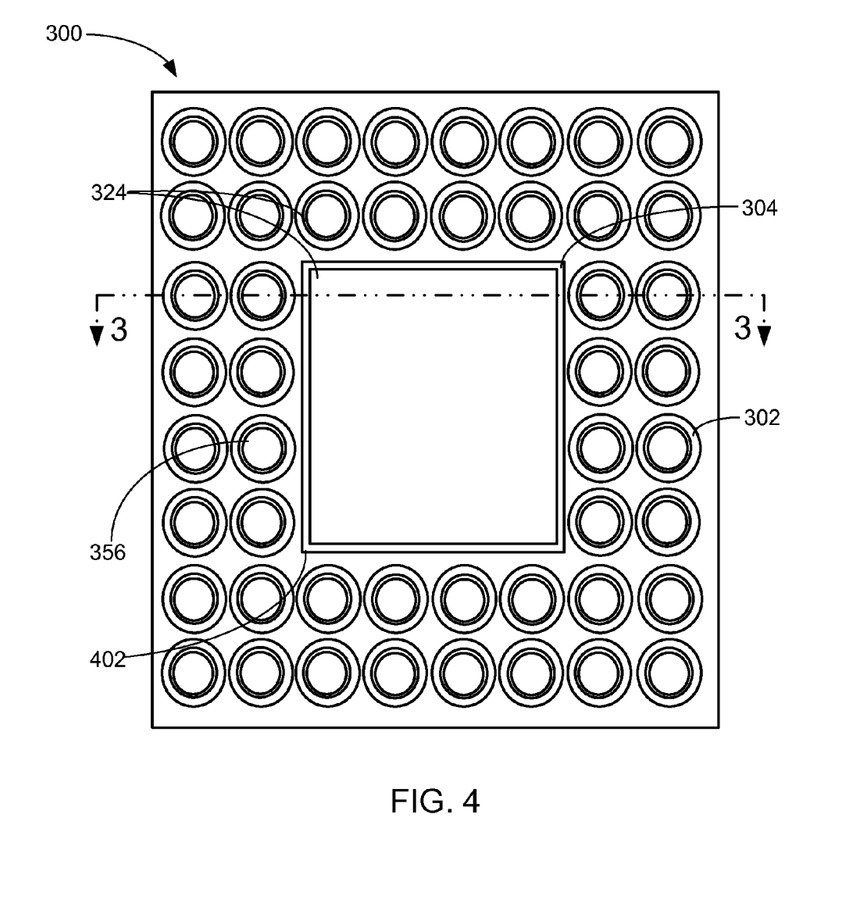
FIG. 4 is a bottom view of FIG. 3.

Referring now to FIG. 3, therein is shown a cross-sectional view of an integrated circuit packaging system 300 taken along a line 3-3 of FIG. 4 in a second embodiment of the present invention. The integrated circuit packaging system 300 includes interconnects 302 adjacent horizontally to a die paddle 304, an integrated circuit device 306 mounted over the die paddle 304, and an encapsulation 308 covering the integrated circuit device 306 and a portion of the die paddle 304 and of the interconnects 302. The integrated circuit packaging system 300 can be referred to as having a plain paddle option.

The interconnects 302 are formed of an electrically conductive material that can include a copper, a copper alloy, or a material having properties similar to properties of the copper or copper alloy. Each of the interconnects 302 are formed having an upper portion 312 integral with a lower portion 314. The upper portion 312 and the lower portion 314 of the interconnects 302 have non-horizontal curved shaped sides that are exposed from a conductive plating 324.

The vertical distance from an end of the upper portion 312 and the intersection of the upper portion 312 and the lower portion 314 is defined as an anchor depth 316. The vertical distance from an end of the lower portion 314 and the intersection of the upper portion 312 and the lower portion 314 is defined as a standoff height 318. A ridge shaped protrusion 320 is formed at the intersection of the upper portion 312 and the lower portion 314.

For illustrative purposes, the anchor depth 316 is shown to be twice the standoff height 318 to increase pullout resistance of the interconnects 302. The anchor depth 316 and the standoff height can have other dimensional relationships. For example, the anchor depth 316 can be one-half of the standoff height 318 to provide for an increase in package Z-height or an increased pitch of the interconnects 302.

A concave indentation 322 is defined as a cavity having a concaved interior shape. The end of the lower portion 314 is formed having the concave indentation 322. The conductive plating 324 can be used to optionally cover the end of the lower portion 314 including the concave indentation 322. The conductive plating 324 can be formed having a pre-determined thickness.

The conductive plating 324 can be formed of a material that improves cohesive characteristics between the interconnects 302 and a connective material used to connect the integrated circuit packaging system 300 to a next level of integration (not shown), such as a printed circuit board, an electronic component, or a package. The connective material can include solder, metal, metal alloys, or other electrically conductive material.

The upper portion 312 is covered with the conductive plating 324 to provide a surface for connectivity with circuitry of the integrated circuit device 306 and serve as an etch stop during assembly processing. The integrated circuit device 306 is defined as a semiconductor device having active circuitry fabricated thereon and can include an integrated circuit die, an integrated circuit component, or a combination thereof.

The lower portion 314 of the interconnects 302 can be separated from one another by a spatial distance 328. The spatial distance 328 is defined as a horizontal distance separating the lower portion 314 of one of the interconnects 302 and the lower portion 314 of another of the interconnects 302.

The die paddle 304 can be surrounded by the interconnects 302 and be formed of the electrically conductive material used to form the interconnects 302 or of a material having properties similar to properties of the electrically conductive material. The die paddle 304 is formed having an internal portion 332 integral with an external portion 334.

An intersection of the internal portion 332 and the external portion 334 is coplanar with the area formed at the intersection of the upper portion 312 and the lower portion 314. A cross-sectional area formed at the intersection of the internal portion 332 and the external portion 334 is greater than a surface area of the component side of the internal portion 332 or a surface area of the system side of the external portion 334. A side of the die paddle 304 facing away from the integrated circuit device 306 can optionally be covered with the conductive plating 324 or can be bare to expose the electrically conductive material of the die paddle 304.

The conductive plating 324 can optionally be used to improve cohesive characteristics between the die paddle 304 and the next level of integration if the connective material is used to attach the die paddle 304 to the next level of integration. The internal portion 332 is covered with the conductive plating 324 to provide a surface for connectivity with circuitry of the integrated circuit device 306 and serve as an etch stop during assembly processing.

An attachment layer 342 can be used to attach the integrated circuit device 306 to the conductive plating 324 on the die paddle 304. The attachment layer 342 is defined as an adhesive material that can include a glue, a film, an epoxy, or any combination thereof.

The conductive plating 324 can also be exposed around the attachment layer 342 and the integrated circuit device 306. The die paddle 304 has a trench 346 around the integrated circuit device 306 and a periphery of the die paddle 304. The trench 346 can be segmented, formed adjacent one or some sides of the integrated circuit device 306, or completely surround the integrated circuit device 306.

The trench 346 can be formed to penetrate the die paddle 304 to expose a portion of the die paddle 304 from within the trench 346. The trench 346 can be formed having a trench width 348 measured horizontally from one side of the trench 346 to an opposite side of the trench 346. The trench 346 can have a cross-sectional outlined shape of a polygon with straight sides, curved sides, or any side combinations thereof.

The conductive plating 324 on paddle bond sites 352 along the periphery of the internal portion 332 can be used to electrically connect the die paddle 304 with the integrated circuit device 306. The paddle bond sites 352 can include a bond site width 350 measured horizontally across opposing sides of the paddle bond sites 352. The bond site width 350 can be less than the trench width 348.

Electrical connectors 354 attached to the integrated circuit device 306 and the paddle bond sites 352 or the conductive plating 324 covering the upper portion 312 provide connectivity between the integrated circuit device 306 and the die paddle 304 or the interconnects 302. The electrical connectors 354 can include wires, leads, bond wires, or any combination thereof.

The encapsulation 308 can cover the upper portion 312 of the interconnects 302, the internal portion 332 of the die paddle 304, the integrated circuit device 306, and the electrical connectors 354. The encapsulation 308 protects and hermetically seals the contents of the integrated circuit packaging system 300 while exposing the lower portion 314 of the interconnects 302 and the external portion 334 of the die paddle 304.

Package connectors 356 can be attached directly to the concave indentation 322 or to the conductive plating 324 optionally covering the concave indentation 322. The package connectors 356 are formed from the connective material and can have shapes characteristics of an elliptical shape, a spherical shape, a cylindrical shape from printing, or any combination thereof.

The concave indentation 322 can be formed having a shape and dimensions that will capture and cup the package connectors 356. The non-horizontal curved shaped sides of the lower portion 314 surrounding the concave indentation 322 are exposed from the package connectors 356. A cup diameter 358 is defined as a diameter of an open end of the concave indentation 322. A cup depth 360 is defined as a perpendicular distance measured from the open end to a closed end of the concave indentation 322.

The cup diameter 358 and the cup depth 360 of the concave indentation 322 can be pre-determined and formed to capture from ten percent to fifty percent of a diameter of the package connectors 356. Diameters of the package connectors 356 captured by the concave indentation 322 can range from four tenths of a millimeter to less than twenty-five hundredths of a millimeter.

It has been discovered that the concave indentation 322 of the interconnects 302 eliminates package or board level failures from multi-directional forces or stress applied to the interconnects 302.

It has also been discovered that the cup diameter 358 and the cup depth 360 of the concave indentation 322 provides a flexible packaging solution that is adaptable to print or ball types of the package connectors 356.

It has further been discovered that the trench 346 prevents overflow or contamination of the paddle bond sites 352 from the attachment layer 342 to improve yield and reliability for the integrated circuit packaging system 300.

It has yet further been discovered that the combination of the spatial distance 328, the standoff height 318, and the cup diameter 358 and the cup depth 360 of the concave indentation 322 provides the interconnects 302 with attachment capabilities for the package connectors 356 to be of balled or print technologies and having any pitch or size.

It has yet further been discovered that the combination of the ridge shaped protrusion 320, the curved shaped sides of the interconnects 302, and the concave indentation 322 of the interconnects 302 provide superior board level reliability by preventing relative movement between the package connectors 356 and the interconnects 302 and relative movement between the interconnects 302 and the encapsulation 308.

Referring now to FIG. 4, therein is shown a bottom view of FIG. 3. Shown are the package connectors 356 on the conductive plating 324 of the interconnects 302 outside a perimeter 402 or the periphery of the die paddle 304. The encapsulation 308 is also shown surrounding the die paddle 304 and each of the interconnects 302.

Figure 5:
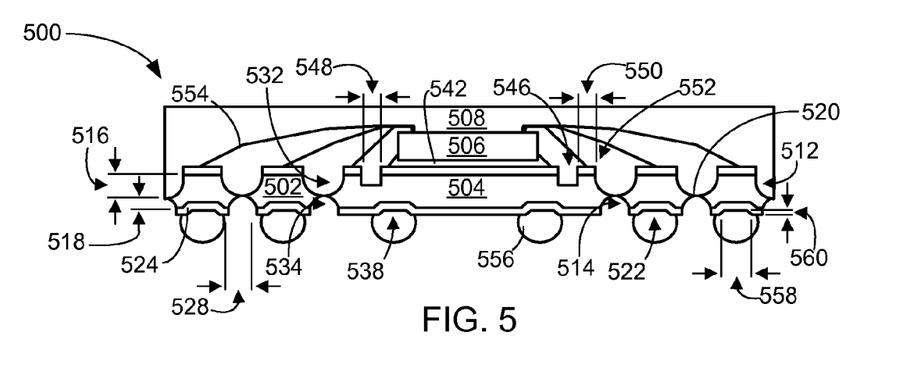
FIG. 5 is a cross-sectional view of an integrated circuit packaging system taken along a line 5-5 of FIG. 6 in a third embodiment of the present invention.
Figure 6:
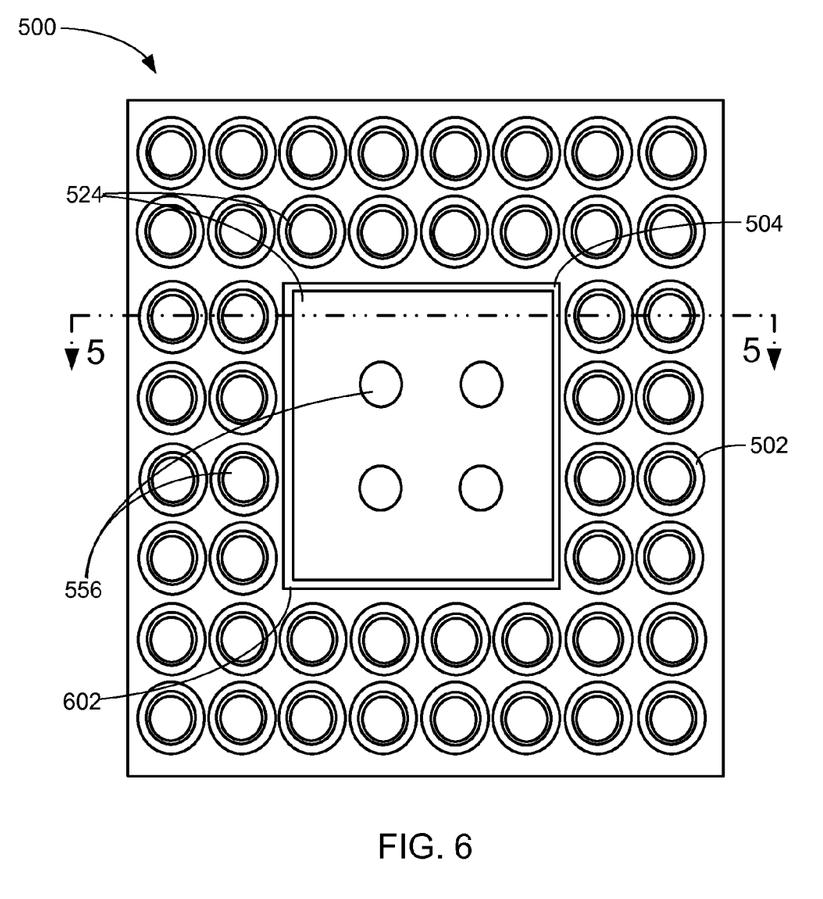
FIG. 6 is a bottom view of FIG. 5.

Referring now to FIG. 5, therein is shown a cross-sectional view of an integrated circuit packaging system 500 taken along a line 5-5 of FIG. 6 in a third embodiment of the present invention. The integrated circuit packaging system 500 includes interconnects 502 aligned horizontally adjacent to a die paddle 504, an integrated circuit device 506 mounted over the die paddle 504, and an encapsulation 508 covering the integrated circuit device 506 and a portion of the die paddle 504 and of the interconnects 502. The integrated circuit packaging system 500 can be referred to as having a de-populated paddle option.

The interconnects 502 are formed of an electrically conductive material that can include a copper, a copper alloy, or a material having properties similar to properties of the copper or copper alloy. Each of the interconnects 502 are formed having an upper portion 512 integral with a lower portion 514. The upper portion 512 and the lower portion 514 of the interconnects 502 have non-horizontal curved shaped sides that are exposed from a conductive plating 524.

The vertical distance from an end of the upper portion 512 and the intersection of the upper portion 512 and the lower portion 514 is defined as an anchor depth 516. The vertical distance from an end of the lower portion 514 and the intersection of the upper portion 512 and the lower portion 514 is defined as a standoff height 518. A ridge shaped protrusion 520 is formed at the intersection of the upper portion 512 and the lower portion 514.

For illustrative purposes, the anchor depth 516 is shown to be twice the standoff height 518 to increase pullout resistance of the interconnects 502. The anchor depth 516 and the standoff height can have other dimensional relationships. For example, the anchor depth 516 can be one-half of the standoff height 518 to provide for an increase in package Z-height or an increased pitch of the interconnects 502.

A concave indentation 522 is defined as a cavity having a concaved interior shape. The end of the lower portion 514 is formed having the concave indentation 522. The conductive plating 524 can be used to optionally cover the end of the lower portion 514 including the concave indentation 522. The conductive plating 524 can be formed having a pre-determined thickness.

The conductive plating 524 can be formed of a material that improves cohesive characteristics between the interconnects 502 and a connective material used to connect the integrated circuit packaging system 500 to a next level of integration (not shown), such as a printed circuit board, an electronic component, or a package. The connective material can include solder, metal, metal alloys, or other electrically conductive material.

The upper portion 512 is covered with the conductive plating 524 to provide a surface for connectivity with circuitry of the integrated circuit device 506 and serve as an etch stop during assembly processing. The integrated circuit device 506 is defined as a semiconductor device having active circuitry fabricated thereon and can include an integrated circuit die, an integrated circuit component, or a combination thereof.

The lower portion 514 of the interconnects 502 can be separated from one another by a spatial distance 528. The spatial distance 528 is defined as a horizontal distance separating the lower portion 514 of one of the interconnects 502 and the lower portion 514 of another of the interconnects 502.

The die paddle 504 can be surrounded by the interconnects 502 and be formed of the electrically conductive material used to form the interconnects 502 or of a material having properties similar to properties of the electrically conductive material. The die paddle 504 is formed having an internal portion 532 integral with an external portion 534.

An intersection of the internal portion 532 and the external portion 534 is coplanar with the area formed at the intersection of the upper portion 512 and the lower portion 514. A cross-sectional area formed at the intersection of the internal portion 532 and the external portion 534 is greater than a surface area of the component side of the internal portion 532 or a surface area of the system side of the external portion 534.

The external portion 534 can optionally include at least one paddle indentation 538 having dimensions of the concave indentation 522. The paddle indentation 538 can optionally be covered with the conductive plating 524.

The conductive plating 524 improves cohesive characteristics between the die paddle 504 and the connective material used to connect the integrated circuit packaging system 500 to the next level of integration. The internal portion 532 is covered with the conductive plating 524 to provide a surface for connectivity with circuitry of the integrated circuit device 506 and serve as an etch stop during assembly processing.

An attachment layer 542 can be used to attach the integrated circuit device 506 to the conductive plating 524 on the die paddle 504. The attachment layer 542 is defined as an adhesive material that can include a glue, a film, an epoxy, or any combination thereof.

The conductive plating 524 can also be exposed around the attachment layer 542 and the integrated circuit device 506. The die paddle 504 has a trench 546 around the integrated circuit device 506 and a periphery of the die paddle 504. The trench 546 can be segmented, formed adjacent one or some sides of the integrated circuit device 506, or completely surround the integrated circuit device 506.

The trench 546 can be formed to penetrate the die paddle 504 to expose a portion of the die paddle 504 from within the trench 546. The trench 546 can be formed having a trench width 548 measured horizontally from one side of the trench 546 to an opposite side of the trench 546. The trench 546 can have a cross-sectional outlined shape of a polygon with straight sides, curved sides, or any side combinations thereof.

The conductive plating 524 on paddle bond sites 552 along the periphery of the internal portion 532 can be used to electrically connect the die paddle 504 with the integrated circuit device 506. The paddle bond sites 552 can include a bond site width 550 measured horizontally across opposing sides of the paddle bond sites 552. The bond site width 550 can be less than the trench width 548.

Electrical connectors 554 attached to the integrated circuit device 506 and the paddle bond sites 552 or the conductive plating 524 covering the upper portion 512 provide connectivity between the integrated circuit device 506 and the die paddle 504 or the interconnects 502. The electrical connectors 554 can include wires, leads, bond wires, or any combination thereof.

The encapsulation 508 can cover the upper portion 512 of the interconnects 502, the internal portion 532 of the die paddle 504, the integrated circuit device 506, and the electrical connectors 554. The encapsulation 508 protects and hermetically seals the contents of the integrated circuit packaging system 500 while exposing the lower portion 514 of the interconnects 502 and the external portion 534 of the die paddle 504.

Package connectors 556 can be attached directly to the concave indentation 522 or to the conductive plating 524 optionally covering the concave indentation 522. The package connectors 556 are formed from the connective material and can have shapes characteristics of an elliptical shape, a spherical shape, a cylindrical shape from printing, or any combination thereof.

The concave indentation 522 can be formed having a shape and dimensions that will capture and cup the package connectors 556. The non-horizontal curved shaped sides of the lower portion 514 surrounding the concave indentation 522 are exposed from the package connectors 556. A cup diameter 558 is defined as a diameter of an open end of the concave indentation 522. A cup depth 560 is defined as a perpendicular distance measured from the open end to a closed end of the concave indentation 522.

The cup diameter 558 and the cup depth 560 of the concave indentation 522 can be pre-determined and formed to capture from ten percent to fifty percent of a diameter of the package connectors 556. Diameters of the package connectors 556 captured by the concave indentation 522 can range from four tenths of a millimeter to less than twenty-five hundredths of a millimeter.

It has been discovered that the concave indentation 522 of the interconnects 502 eliminates package or board level failures from multi-directional forces or stress applied to the interconnects 502.

It has also been discovered that the cup diameter 558 and the cup depth 560 of the concave indentation 522 provides a flexible packaging solution that is adaptable to print or ball types of the package connectors 556.

It has further been discovered that the trench 546 prevents overflow or contamination of the paddle bond sites 552 from the attachment layer 542 to improve yield and reliability for the integrated circuit packaging system 500.

It has yet further been discovered that the combination of the spatial distance 528, the standoff height 518, and the cup diameter 558 and the cup depth 560 of the concave indentation 522 provides the interconnects 502 with attachment capabilities for the package connectors 556 to be of balled or print technologies and having any pitch or size.

It has yet further been discovered that the combination of the ridge shaped protrusion 520, the curved shaped sides of the interconnects 502, and the concave indentation 522 of the interconnects 502 provide superior board level reliability by preventing relative movement between the package connectors 556 and the interconnects 502 and relative movement between the interconnects 502 and the encapsulation 508.

Referring now to FIG. 6, therein is shown a bottom view of FIG. 5. Shown are the package connectors 556 on the conductive plating 524 within a perimeter 602 or the periphery of the die paddle 504 and the interconnects 502. The encapsulation 508 is also shown surrounding the die paddle 504 and each of the interconnects 502.

Figure 7:
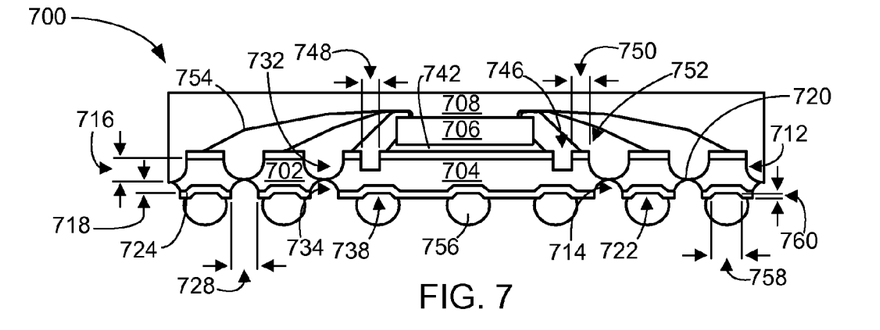
FIG. 7 is a cross-sectional view of an integrated circuit packaging system taken along a line 7-7 of FIG. 8 in a fourth embodiment of the present invention.
Figure 8:
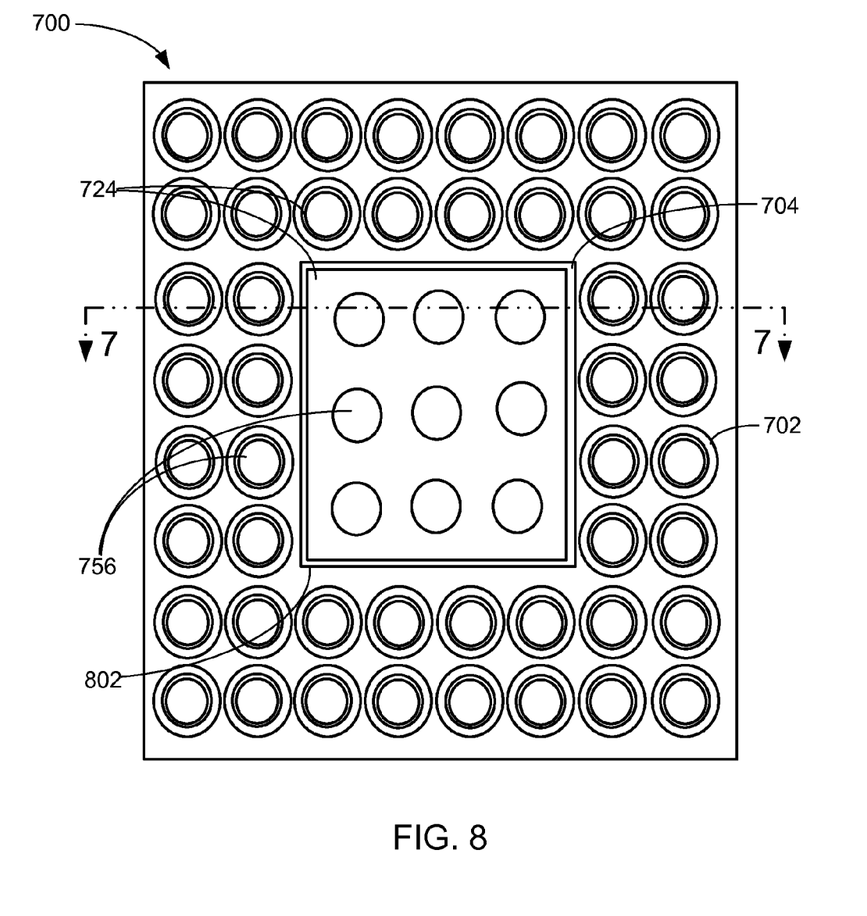
FIG. 8 is a bottom view of FIG. 7.

Referring now to FIG. 7, therein is shown a cross-sectional view of an integrated circuit packaging system 700 taken along a line 7-7 of FIG. 8 in a fourth embodiment of the present invention. The integrated circuit packaging system 700 includes interconnects 702 aligned horizontally adjacent to a die paddle 704, an integrated circuit device 706 mounted over the die paddle 704, and an encapsulation 708 covering the integrated circuit device 706 and a portion of the die paddle 704 and of the interconnects 702. The integrated circuit packaging system 700 can be referred to as having a populated paddle option.

The interconnects 702 are formed of an electrically conductive material that can include a copper, a copper alloy, or a material having properties similar to properties of the copper or copper alloy. Each of the interconnects 702 are formed having an upper portion 712 integral with a lower portion 714. The upper portion 712 and the lower portion 714 of the interconnects 702 have non-horizontal curved shaped sides that are exposed from a conductive plating 724.

The vertical distance from an end of the upper portion 712 and the intersection of the upper portion 712 and the lower portion 714 is defined as an anchor depth 716. The vertical distance from an end of the lower portion 714 and the intersection of the upper portion 712 and the lower portion 714 is defined as a standoff height 718. A ridge shaped protrusion 720 is formed at the intersection of the upper portion 712 and the lower portion 714.

For illustrative purposes, the anchor depth 716 is shown to be twice the standoff height 718 to increase pullout resistance of the interconnects 702. The anchor depth 716 and the standoff height can have other dimensional relationships. For example, the anchor depth 716 can be one-half of the standoff height 718 to provide for an increase in package Z-height or an increased pitch of the interconnects 702.

A concave indentation 722 is defined as a cavity having a concaved interior shape. The end of the lower portion 714 is formed having the concave indentation 722. The conductive plating 724 can be used to optionally cover the end of the lower portion 714 including the concave indentation 722. The conductive plating 724 can be formed having a pre-determined thickness.

The conductive plating 724 can be formed of a material that improves cohesive characteristics between the interconnects 702 and a connective material used to connect the integrated circuit packaging system 700 to a next level of integration (not shown), such as a printed circuit board, an electronic component, or a package. The connective material can include solder, metal, metal alloys, or other electrically conductive material.

The upper portion 712 is covered with the conductive plating 724 to provide a surface for connectivity with circuitry of the integrated circuit device 706 and serve as an etch stop during assembly processing. The integrated circuit device 706 is defined as a semiconductor device having active circuitry fabricated thereon and can include an integrated circuit die, an integrated circuit component, or a combination thereof.

The lower portion 714 of the interconnects 702 can be separated from one another by a spatial distance 728. The spatial distance 728 is defined as a horizontal distance separating the lower portion 714 of one of the interconnects 702 and the lower portion 714 of another of the interconnects 702.

The die paddle 704 can be surrounded by the interconnects 702 and be formed of the electrically conductive material used to form the interconnects 702 or of a material having properties similar to properties of the electrically conductive material. The die paddle 704 is formed having an internal portion 732 integral with an external portion 734.

An intersection of the internal portion 732 and the external portion 734 is coplanar with the area formed at the intersection of the upper portion 712 and the lower portion 714. A cross-sectional area formed at the intersection of the internal portion 732 and the external portion 734 is greater than a surface area of the component side of the internal portion 732 or a surface area of the system side of the external portion 734.

The external portion 734 can optionally include at least one paddle indentation 738 having dimensions of the concave indentation 722. The paddle indentation 738 can optionally be covered with the conductive plating 724.

The conductive plating 724 improves cohesive characteristics between the die paddle 704 and the connective material used to connect the integrated circuit packaging system 700 to the next level of integration. The internal portion 732 is covered with the conductive plating 724 to provide a surface for connectivity with circuitry of the integrated circuit device 706 and serve as an etch stop during assembly processing.

An attachment layer 742 can be used to attach the integrated circuit device 706 to the conductive plating 724 on the die paddle 704. The attachment layer 742 is defined as an adhesive material that can include a glue, a film, an epoxy, or any combination thereof.

The conductive plating 724 can also be exposed around the attachment layer 742 and the integrated circuit device 706. The die paddle 704 has a trench 746 around the integrated circuit device 706 and a periphery of the die paddle 704. The trench 746 can be segmented, formed adjacent one or some sides of the integrated circuit device 706, or completely surround the integrated circuit device 706.

The trench 746 can be formed to penetrate the die paddle 704 to expose a portion of the die paddle 704 from within the trench 746. The trench 746 can be formed having a trench width 748 measured horizontally from one side of the trench 746 to an opposite side of the trench 746. The trench 746 can have a cross-sectional outlined shape of a polygon with straight sides, curved sides, or any side combinations thereof.

The conductive plating 724 on paddle bond sites 752 along the periphery of the internal portion 732 can be used to electrically connect the die paddle 704 with the integrated circuit device 706. The paddle bond sites 752 can include a bond site width 750 measured horizontally across opposing sides of the paddle bond sites 752. The bond site width 750 can be less than the trench width 748.

Electrical connectors 754 attached to the integrated circuit device 706 and the paddle bond sites 752 or the conductive plating 724 covering the upper portion 712 provide connectivity between the integrated circuit device 706 and the die paddle 704 or the interconnects 702. The electrical connectors 754 can include wires, leads, bond wires, or any combination thereof.

The encapsulation 708 can cover the upper portion 712 of the interconnects 702, the internal portion 732 of the die paddle 704, the integrated circuit device 706, and the electrical connectors 754. The encapsulation 708 protects and hermetically seals the contents of the integrated circuit packaging system 700 while exposing the lower portion 714 of the interconnects 702 and the external portion 734 of the die paddle 704.

Package connectors 756 can be attached directly to the concave indentation 722 or to the conductive plating 724 optionally covering the concave indentation 722. The package connectors 756 are formed from the connective material and can have shapes characteristics of an elliptical shape, a spherical shape, a cylindrical shape from printing, or any combination thereof.

The concave indentation 722 can be formed having a shape and dimensions that will capture and cup the package connectors 756. The non-horizontal curved shaped sides of the lower portion 714 surrounding the concave indentation 722 are exposed from the package connectors 756. A cup diameter 758 is defined as a diameter of an open end of the concave indentation 722. A cup depth 760 is defined as a perpendicular distance measured from the open end to a closed end of the concave indentation 722.

The cup diameter 758 and the cup depth 760 of the concave indentation 722 can be pre-determined and formed to capture from ten percent to fifty percent of a diameter of the package connectors 756. Diameters of the package connectors 756 captured by the concave indentation 722 can range from four tenths of a millimeter to less than twenty-five hundredths of a millimeter.

It has been discovered that the concave indentation 722 of the interconnects 702 eliminates package or board level failures from multi-directional forces or stress applied to the interconnects 702.

It has also been discovered that the cup diameter 758 and the cup depth 760 of the concave indentation 722 provides a flexible packaging solution that is adaptable to print or ball types of the package connectors 756.

It has further been discovered that the trench 746 prevents overflow or contamination of the paddle bond sites 752 from the attachment layer 742 to improve yield and reliability for the integrated circuit packaging system 700.

It has yet further been discovered that the combination of the spatial distance 728, the standoff height 718, and the cup diameter 758 and the cup depth 760 of the concave indentation 722 provides the interconnects 702 with attachment capabilities for the package connectors 756 to be of balled or print technologies and having any pitch or size.

It has yet further been discovered that the combination of the ridge shaped protrusion 720, the curved shaped sides of the interconnects 702, and the concave indentation 722 of the interconnects 702 provide superior board level reliability by preventing relative movement between the package connectors 756 and the interconnects 702 and relative movement between the interconnects 702 and the encapsulation 708.

Referring now to FIG. 8, therein is shown a bottom view of FIG. 7. Shown are the package connectors 756 on the conductive plating 724 within a perimeter 802 or the periphery of the die paddle 704 and the interconnects 702. The encapsulation 708 is also shown surrounding the die paddle 704 and each of the interconnects 702.

Figure 9:
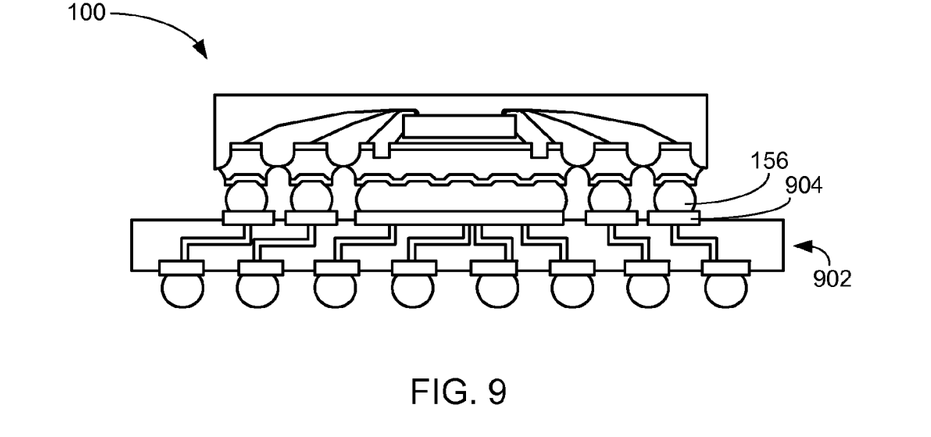
FIG. 9 is the cross-sectional view of the integrated circuit packaging system of FIG. 1 connected to a next level of integration.

Referring now to FIG. 9, therein is shown the cross-sectional view of the integrated circuit packaging system 100 of FIG. 1 connected to a next level of integration 902. Each of the package connectors 156 can be used to connect the integrated circuit packaging system 100 to a contact 904 of the next level of integration 902. The next level of integration 902 can include a board, a substrate, an integrated circuit component, or any combination thereof.

Figure 10:
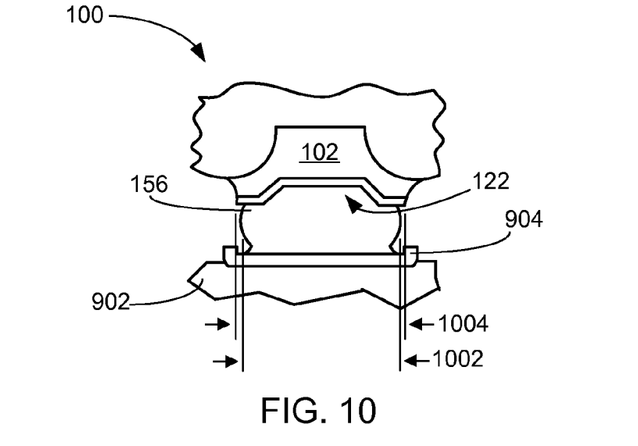
FIG. 10 is a cross-sectional view of one of the package connectors of FIG. 1 using a ball type of connector.

Referring now to FIG. 10, therein is shown a cross-sectional view of one of the package connectors 156 of FIG. 1 using a ball type of connector. The one of the package connectors 156 is shown attached to the concave indentation 122 of one of the interconnects 102 and the contact 904 of the next level of integration 902.

A body width 1002 is defined as a width of the package connectors 156, after reflow, measured across a horizontal cross-section of the package connectors 156. An indentation width 1004 is defined as a width of a periphery of the concave indentation 122 measured across a horizontal cross-section of the concave indentation 122. The body width 1002 can be less than the indentation width 1004.

It has been discovered that the concave indentation 122 forming the package connectors 156 having the body width 1002 less than the indentation width 1004 provides a packaging system with minimized pitch capabilities, elimination of connector bridging defects, and maximum board level reliability.

It has also been discovered that the concave indentation 122 of the package connectors 156 using a ball type connector can provide a lower package standoff height resulting in a smaller Z-height for miniature products.

Figure 11:
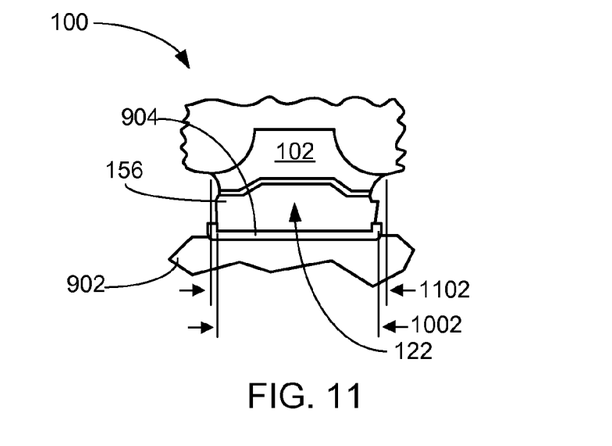
FIG. 11 is a cross-sectional view of one of the package connectors of FIG. 1 using a print type of connector.

Referring now to FIG. 11, therein is shown a cross-sectional view of one of the package connectors 156 of FIG. 1 using a print type of connector. The one of the package connectors 156 is shown attached to the concave indentation 122 of one of the interconnects 102 and the contact 904 of the next level of integration 902.

A horizontal width of an area formed at the intersection of the upper portion 112 of FIG. 1 and the lower portion 114 of FIG. 1 is defined as an interconnect width 1102. The package connectors 156 of print type can form the body width of the package connectors 156 less than the interconnect width 1102.

It has been discovered that the concave indentation 122 forming the package connectors 156 having the body width 1002 less than the interconnect width 1102 provides a packaging system with minimized pitch capabilities, elimination of connector bridging defects, and maximum board level reliability.

Figure 12:
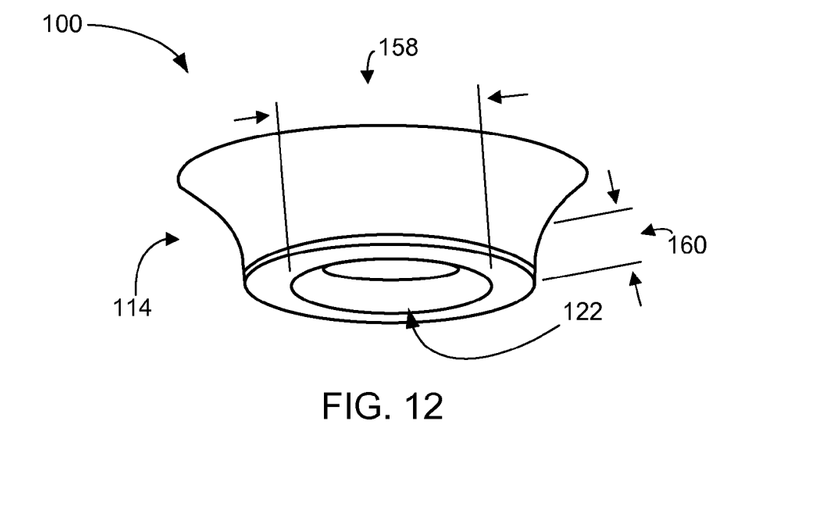
FIG. 12 is an isometric view of a portion of one of the interconnects of FIG. 1.

Referring now to FIG. 12, therein is shown an isometric view of a portion of one of the interconnects 102 of FIG. 1. A detailed view of the lower portion 114 and the concave indentation 122 of one of the interconnects 102 is shown. The interior of the concave indentation 122 is shown having a cupped shape to provide increased solder interface coverage and adhesion.

It has been discovered that the cupped shape within the concave indentation 122 provides an enhanced locking effect, which improves the board level reliability and reduces the risk of delamination due to multi-directional forces or stress.

It has also been discovered that the package Z-height can be adjusted without a change in the solder ball height by changing the cup diameter 158 and the cup depth 160 to provide a low profile package and a benefit of the package connectors 156 of FIG. 9 that are immune to stress failures due to cracks, fissures, or fracturing.

Figure 13:
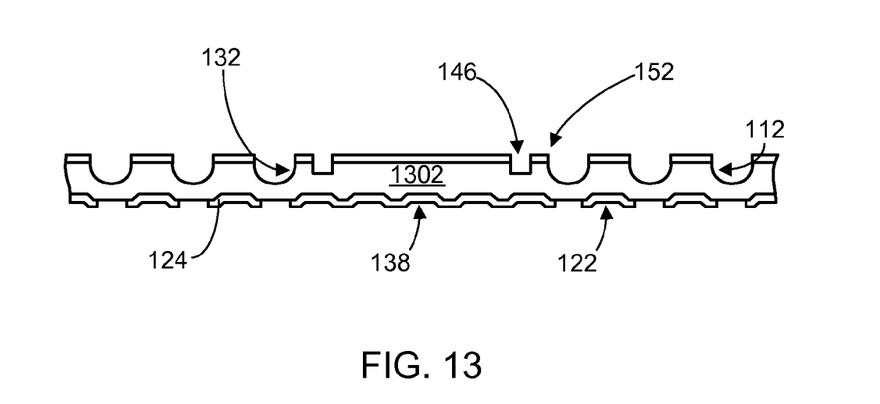
FIG. 13 is a cross-sectional view of a leadframe for the integrated circuit packaging system of FIG. 1 in a preparation phase of manufacturing.

Referring now to FIG. 13, therein is shown a cross-sectional view of a leadframe 1302 for the integrated circuit packaging system 100 of FIG. 1 in a preparation phase of manufacturing. A side of the leadframe 1302 can include areas covered with the conductive plating 124 and formed having the trench 146, the paddle bond sites 152, and openings separating areas having the conductive plating 124 using a material removal process such as etching, grinding, cutting, or an equivalent removal process.

The material removal process results in the formation of the protruding structures having shape, size, and non-horizontal curved shaped sides similar to the upper portion 112 of FIG. 1 and the internal portion 132 of FIG. 1 of the interconnects 102 of FIG. 1 and the die paddle 104 of FIG. 1, respectively. A side of the leadframe 1302 opposite the side having the trench 146 can be formed during a forming phase to have the concave indentation 122 at locations corresponding with the interconnects 102 and the die paddle 104.

The forming phase can include an indentation process such as an etching, a milling, a grinding, and a stamping process. The concave indentation 122 and the paddle indentation 138 can optionally be covered with the conductive plating 124.

For illustrative purposes, the leadframe 1302 shown can be used to produce several copies of the integrated circuit packaging system 100. The dimensions of the leadframe 1302 can be adjusted to produce any quantity of replicas of the integrated circuit packaging system 100. For example, the leadframe 1302 can be sized to manufacture three copies of the integrated circuit packaging system 100.

Figure 14:
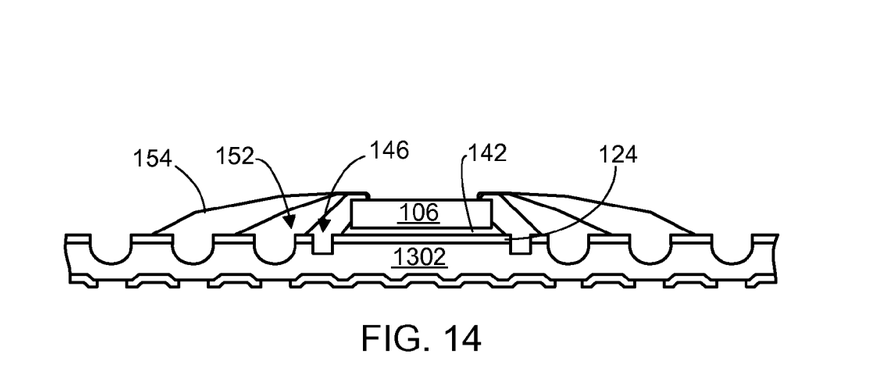
FIG. 14 is the cross-sectional view of FIG. 13 in a connection phase.

Referring now to FIG. 14, therein is shown the cross-sectional view of FIG. 13 in a connection phase. The integrated circuit device 106 is attached to the conductive plating 124 between opposing locations on the side of the leadframe 1302 having the trench 146 using the attachment layer 142 in a manner similar the integrated circuit packaging system 100 of FIG. 1. The electrical connectors 154 connect the integrated circuit device 106 to the conductive plating 124 of the upper portion 112 and of the paddle bond sites 152.

Figure 15:
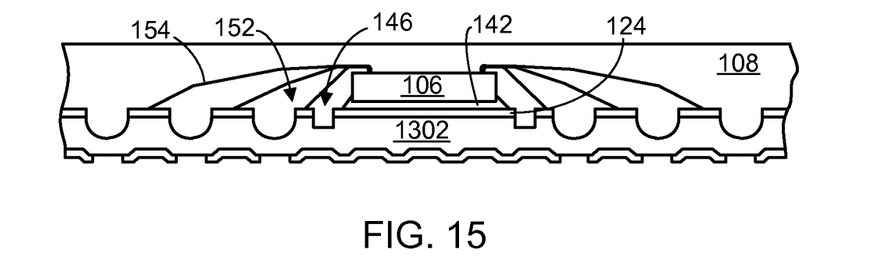
FIG. 15 is the cross-sectional view of FIG. 14 in a molding phase.

Referring now to FIG. 15, therein is shown the cross-sectional view of FIG. 14 in a molding phase. The side of the leadframe 1302 having the trench 146, the electrical connectors 154, the conductive plating 124, the integrated circuit device 106, and the attachment layer 142 is covered with the encapsulation 108 during the molding process. The molding process can include a mold chase, a heating process, a cooling process, and a cleaning process.

Figure 16:
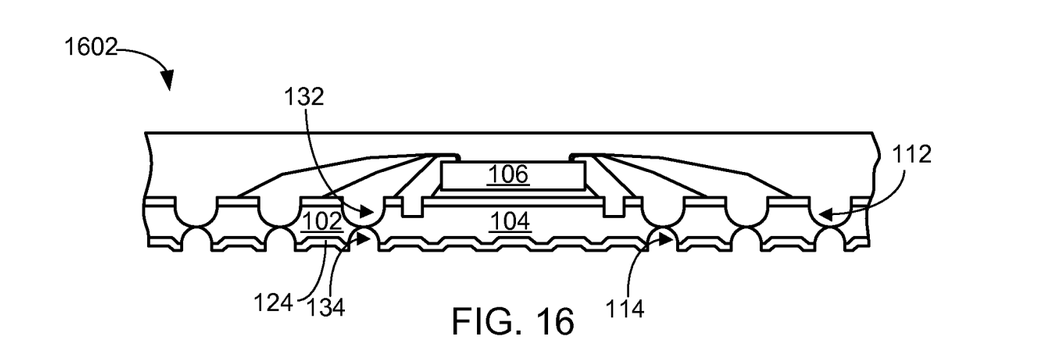
FIG. 16 is the cross-sectional view of FIG. 15 in a lead formation phase.

Referring now to FIG. 16, therein is shown the cross-sectional view of FIG. 15 in a lead formation phase. The side of the leadframe 1302 of FIG. 15 opposite the side of the leadframe 1302 having the trench 146 can be formed having non-horizontal curved shaped sides identical to the lower portion 114 of FIG. 1 and the external portion 134 of FIG. 1 using the material removal process of FIG. 13. Completion of the material removal process results in the formation of an assembly 1602 having the interconnects 102 with the upper portion 112 and the lower portion 114, the die paddle 104 with the internal portion and the external portion 134 in a manner similar to the integrated circuit packaging system 100 of FIG. 1.

Figure 17:
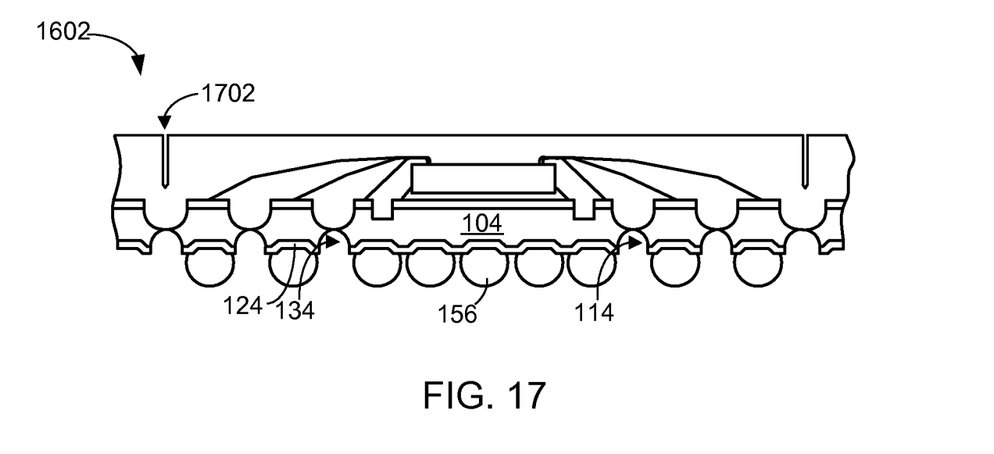
FIG. 17 is the cross-sectional view of FIG. 16 in a singulation phase.

Referring now to FIG. 17, therein is shown the cross-sectional view of FIG. 16 in a singulation phase. The package connectors 156 can be attached to the conductive plating 124 optionally applied to the lower portion 114 and the external portion 134. The assembly 1602 can be further divided to form the integrated circuit packaging system 100 of FIG. 1. during the singulation phase.

The integrated circuit packaging system 100 can be formed by separation from the assembly 1602 using vertical cuts 1702 in a singulation process. The singulation process can include separation process such as a sawing process, a grinding process, or a similar cutting process.

Figure 18:
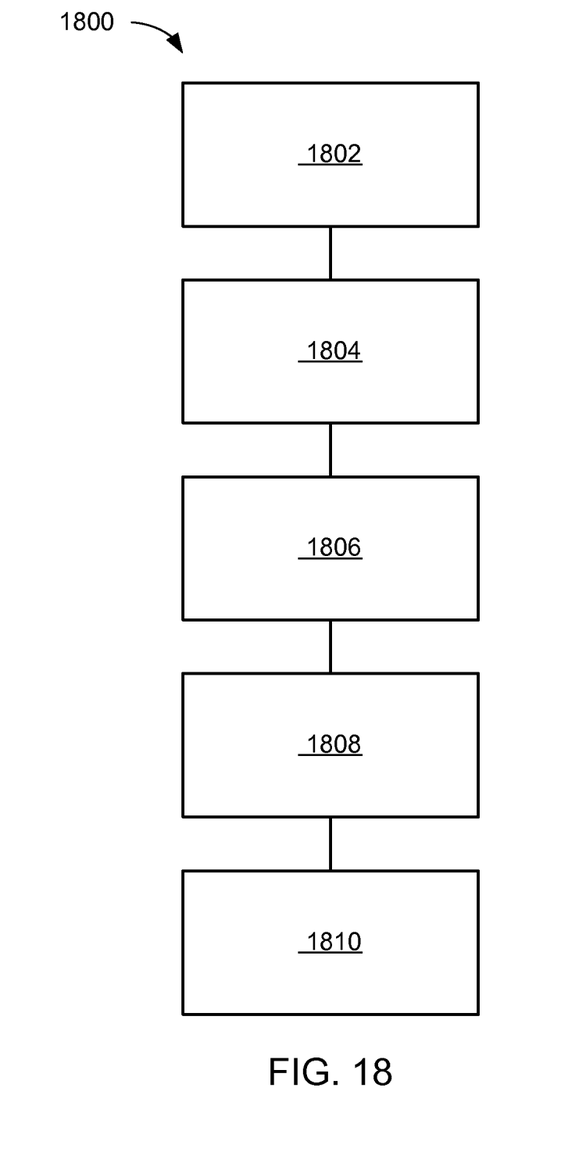
FIG. 18 is a flow chart of a method of manufacture of the integrated circuit packaging system in a further embodiment of the present invention.

Referring now to FIG. 18, therein is shown a flow chart of a method 1800 of manufacture of the integrated circuit packaging system 100 in a further embodiment of the present invention. The method 1800 includes: providing a die paddle having an internal portion with a trench along a perimeter of the die paddle in a block 1802; forming an interconnect having a concave indentation and an upper portion, the upper portion, opposite the concave indentation, aligned horizontally to the internal portion in a block 1804; attaching an integrated circuit device on the die paddle, the trench between the integrated circuit device and the perimeter in a block 1806; attaching an electrical connector to the integrated circuit device and to the upper portion in a block 1808; and applying an encapsulation over the integrated circuit device, the electrical connector, the die paddle, and the interconnect, the concave indentation exposed below the encapsulation in a block 1810.

Thus, it has been discovered that the integrated circuit packaging system with the present invention furnishes important and heretofore unknown and unavailable solutions, capabilities, and functional aspects. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package in package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:

providing a die paddle having an internal portion with a trench along a perimeter of the die paddle;

forming an interconnect having a concave indentation and an upper portion, the upper portion, opposite the concave indentation, aligned horizontally to the internal portion;

attaching an integrated circuit device on the die paddle, the trench between the integrated circuit device and the perimeter;

attaching an electrical connector to the integrated circuit device and the upper portion; and applying an encapsulation over the integrated circuit device, the electrical connector, the die paddle, and the interconnect, the concave indentation and non-horizontal curved sides of the interconnect surrounding the concave indentation exposed below the encapsulation.

2. The method as claimed in claim 1 wherein forming the interconnect having the concave indentation includes applying a conductive plating to cover the concave indentation while exposing non-horizontal sides of the interconnect.

3. The method as claimed in claim 1 further comprising applying a conductive plating on a side of the die paddle opposite the internal portion.

4. The method as claimed in claim 1 further comprising attaching a second electrical connector to the integrated circuit device and to a paddle bond site of the die paddle.

5. The method as claimed in claim 1 further comprising attaching a package connector to the concave indention with non-horizontal curved sides of the interconnect exposed from the package connector.

* * * * *